(12) United States Patent  
Johnson

(10) Patent No.: US 7,724,018 B2  
(45) Date of Patent: May 25, 2010

(54) METHODS AND APPARATUS FOR TRANSLATED WAFER STAND-IN TESTER

(75) Inventor: Morgan T. Johnson, Portland, OR (US)

(73) Assignee: Advanced Inquiry Systems, Inc., Hillsboro, OR (US)

( * ) Notice: Subject to any disclaimer, the term of this patent is extended or adjusted under 35 U.S.C. 154(b) by 0 days.

(21) Appl. No.: 12/365,895

(22) Filed: Feb. 4, 2009

(65) Prior Publication Data

US 2010/0033203 A1    Feb. 11, 2010

Related U.S. Application Data

(63) Continuation of application No. 11/810,951, filed on Jun. 6, 2007, now Pat. No. 7,532,021.

(60) Provisional application No. 60/811,484, filed on Jun. 6, 2006, provisional application No. 60/811,673, filed on Jun. 6, 2006, provisional application No. 60/836,488, filed on Aug. 8, 2006.

(51) Int. Cl.  
*G01R 31/02* (2006.01)  
*G01R 27/28* (2006.01)

(52) U.S. Cl. ............................ 324/765; 324/754

(58) Field of Classification Search .............. None  
See application file for complete search history.

(56) References Cited

U.S. PATENT DOCUMENTS 5,612,570 A * 3/1997 Eide et al. .................. 257/686  
7,532,021 B2 * 5/2009 Johnson ..................... 324/754

* cited by examiner

*Primary Examiner*—Paresh Patel  
(74) *Attorney, Agent, or Firm*—Raymond J. Werner

(57) ABSTRACT

A translated wafer stand-in tester, being a hybrid apparatus capable of emulating the form factor and some or all behaviors of a translated wafer under test, which is operable to store, quantify, encode and convey, either directly or remotely, data from a testing system, including but not limited to pad pressure, electrical contact and temperature. The translated wafer stand-in tester may include several stacked and attached layers, at least one internal layer including electronic components operable to interact with a test system.

10 Claims, 8 Drawing Sheets

METHODS AND APPARATUS FOR TRANSLATED WAFER STAND-IN TESTER

CROSS-REFERENCE TO RELATED APPLICATIONS

This non-provisional application is a continuation of application Ser. No. 11/810,951, filed 6 Jun. 2007, now U.S. Pat. No. 7,532,021, entitled "Methods And Apparatus For Translated Wafer Stand-In Tester", which claimed the benefit of provisional applications 60/811,484, filed 6 Jun. 2006, entitled "Methods and Apparatus for Translated Wafer Stand-In Tester"; 60/811,673 filed 6 Jun. 2006, entitled "Methods and Apparatus for Single Wafer Stand-In Tester"; and 60/836,488, filed 8 Aug. 2006, entitled "Methods and Apparatus for Monolithic Wafer Stand-in Tester"; and the entirety of each is hereby incorporated by reference.

FIELD OF THE INVENTION

The present invention relates generally to semiconductor test equipment, and more particularly relates to methods and apparatus for the evaluation and maintenance of a semiconductor test system.

BACKGROUND

Advances in semiconductor manufacturing technology have resulted in, among other things, reducing the cost of sophisticated electronics to the extent that integrated circuits have become ubiquitous in the modern environment.

As is well-known, integrated circuits are typically manufactured in batches, and these batches usually contain a plurality of semiconductor wafers within and upon which integrated circuits are formed through a variety of semiconductor manufacturing steps, including, for example, depositing, masking, patterning, implanting, etching, and so on.

Completed wafers are tested to determine which die, or integrated circuits, on the wafer are capable of operating according to predetermined specifications. In this way, integrated circuits that cannot perform as desired are not packaged, or otherwise incorporated into finished products.

It is a common practice to use several different test system set-ups in order to test the wafers. Sometimes different test environments are required for low temperature, room temperature, and high temperature testing of the circuits on a wafer. Additionally, different test systems may be used for Built-In Self Test (BIST) style testing, and for application of conventional functional test patterns. Consequently, there is a variety of test equipment for wafer level testing which must be calibrated and verified.

Presently, a number of individual analytical and/or repair tools are required to evaluate the performance, of the various constituent apparatus of wafer sort and wafer burn-in systems. None of these analytical or repair tools emulate closely the actual production configuration of the wafer-level test apparatus.

What is needed are methods and apparatus for calibrating and verifying various wafer level test systems while these test systems are configured closely to their actual production usage configurations.

SUMMARY OF THE INVENTION

Briefly, a translated wafer stand-in tester (TWST), being a hybrid apparatus capable of emulating the form factor and some or all behaviors of a translated wafer under test, additionally containing within it the ability to store, quantify, encode and convey, either directly or remotely, data from a testing system, including but not limited to pad pressure, electrical contact and temperature. The TWST may include several stacked and attached layers, at least one internal layer including electronic components operable to interact with a test system.

DETAILED DESCRIPTION

Figure 1:
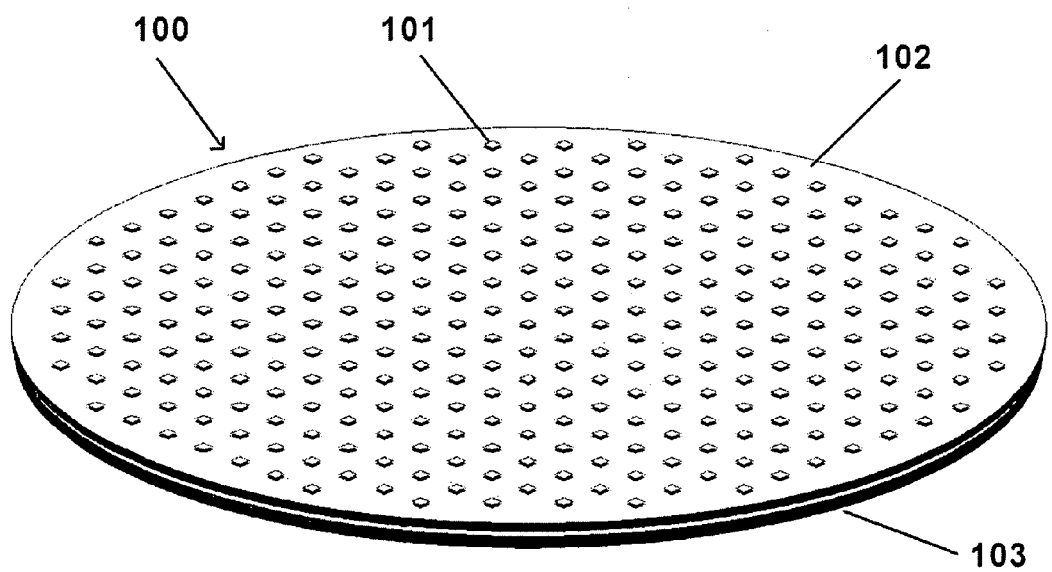
FIG. 1 is a schematic three-dimensional representation of a translated wafer stand-in tester (TWST), in which the vertically aligned elements create an assembly with the same form factor as a combined wafer and translator.

Generally, embodiments of the present invention provide an active replacement for a translated wafer, wherein this replacement may be used to characterize, or otherwise interact with, a wafer-level test system.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

In its operational mode, a wafer-level test assembly verifies the functionality of circuits on a translated wafer. To test the functionality of the test equipment, a translated wafer stand-in tester (TWST) that emulates the form factor of a translated wafer is used in place of an actual translated wafer. When the wafer-level test assembly is then run in its operational mode, sensors on the TWST record and/or transmit data that relate to the operation of the tester.

In one embodiment, upon completion of the operational test, the TWST may be mounted on, or otherwise coupled to, another contact array, where the TWST may be queried for the data accumulated during the test cycle. In an alternative embodiment, it is possible to build into the wafer-level test assembly permanent sensors that would uniquely contact the TWST, allowing for real-time reporting of test data. In another alternative embodiment, the data may be transmitted by the TWST via radio signal. It is not envisioned that wires would be run outside of the stand-in assembly to monitor test, inasmuch as these could interfere with hot, cold and ambient temperature tests.

In some embodiments, the thermal impedance of the entire assembly is made to match as closely as possible a wafer under test, so that TWST does not significantly alter the thermally related results. This is accomplished in one embodiment by creating all levels of the TWST from metallized silicon which has been thinned and machined with a laser or other means to create cavities or wiring that would be stacked in a manner previously described. This laser machining may be accomplished in a manner to prevent microcracking and other potential failure modes that would interfere with the TWST's ability to survive numerous thermally active test cycles. Methods for this include, but are not limited to, silicon oxide and/or silicon nitride coatings over the silicon. Such coatings may also act to reinforce the openings necessary to make room for the devices buried within the assembly.

Alternative embodiments provide special purpose TWSTs that are optimized for the monitoring of particular aspects of the test cycle, such as temperature, distribution of temperature, contact pressure and other variables requiring high accuracy reporting across the entire surface. In some cases, individual layers may be fully functional, and, because of their congruent vertical contacts, can be stacked in groups to create the particular test structure appropriate for that particular wafer-level tester configuration or an anticipated wafer/translator combination.

Given sufficient quantities of sensors and subsequent correct analysis, a TWST's characterization of a wafer-level test assembly can be quite thorough, and repair or tuning steps can be accurately laid out.

Referring to FIG. 1, a translated wafer stand-in tester 100 is shown in its assembled form. TWST 100 includes a plurality of substrates which are vertically aligned and combined in a stack. An insulating substrate, or board 103, has an upper surface 102, upon which a plurality of electrical contacts 101 are disposed. Electrical contacts 101 are laid out in a pattern that is suitable for making contact with a wafer-level test system. Board 103 may also be referred to as a tester interface connection board. TWST 100 has the same form factor as the wafers which the wafer-level test system is configured to receive for testing.

Figure 2:
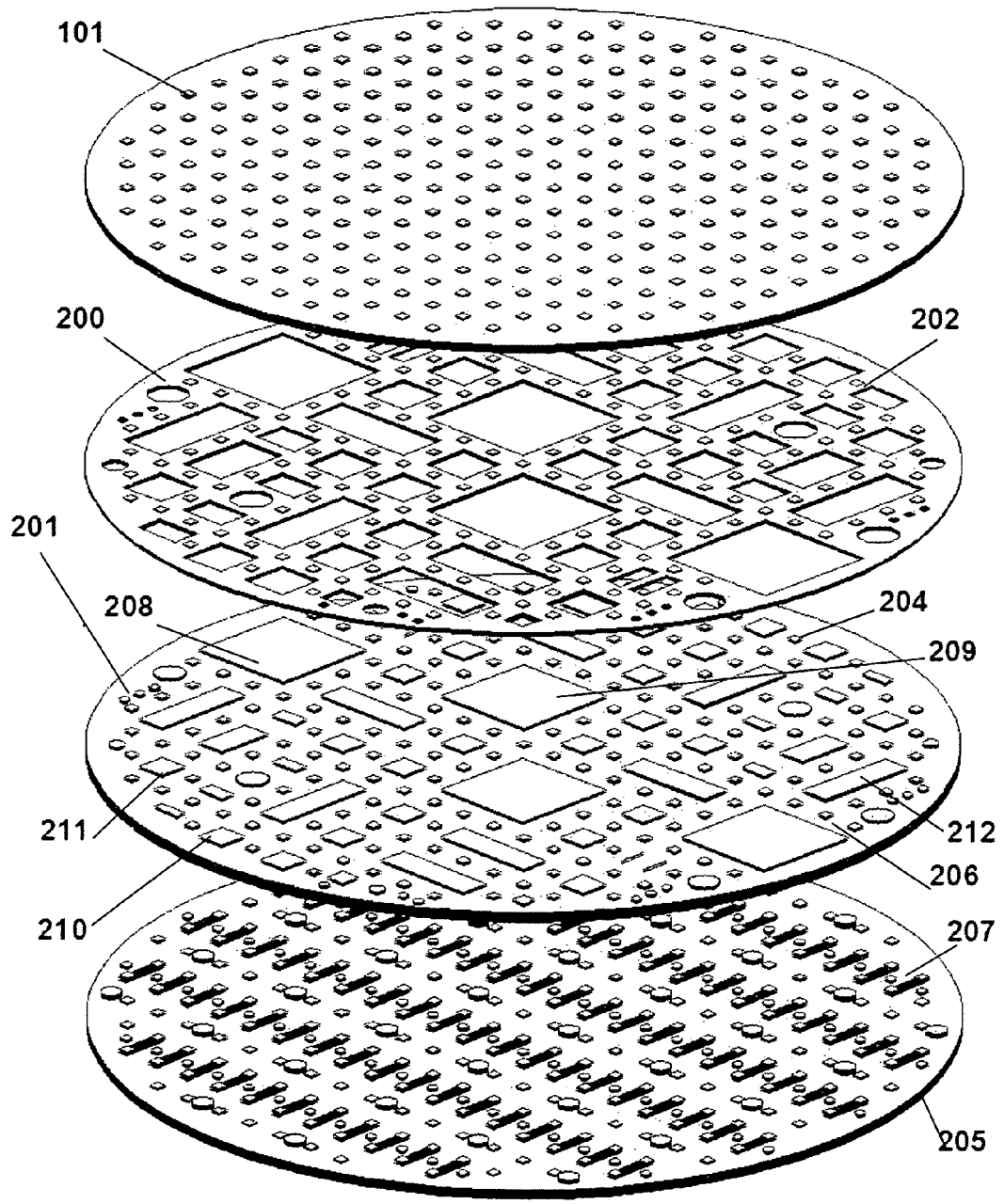
FIG. 2 is an exploded, three-dimensional representation of the translated wafer stand-in tester of FIG. 1.

FIG. 2 is an exploded, three-dimensional representation of the TWST assembly of FIG. 1. The underside of board 103 contacts a spacer board 200 that is approximately equal in thickness to a plurality of devices 208-212 that are mounted on a board 201. These devices may include, but are not limited to, a Field Programmable Gate Array (FPGA) 208; a battery pack 209; a voltage regulator 210; a non-volatile memory module 211; and a thermocouple temperature converter 212. A plurality of electrical contacts 202 on board 200 conduct signals to corresponding, vertically aligned electrical contacts 204 on board 201, and to corresponding, vertically aligned electrical contacts on the underside of board 103. Electrical contacts 202, 204 and 206, though not occurring on every level, where they do occur are vertically aligned, thereby creating vertically conductive pathways throughout the structure. An optional fourth board 205, may include a switch matrix 207 that is used to effectively multiply the device count when the number of electrical contacts on the subject wafer exceeds the resources available on board 201. An array of switches 207 on board 205 conducts electrical signals for redistribution to the various types of electrical devices 208-212 mounted on board 201. Board 205 also contains a plurality of vertically aligned electrical contacts 206 corresponding to those on board 201.

Figure 3:
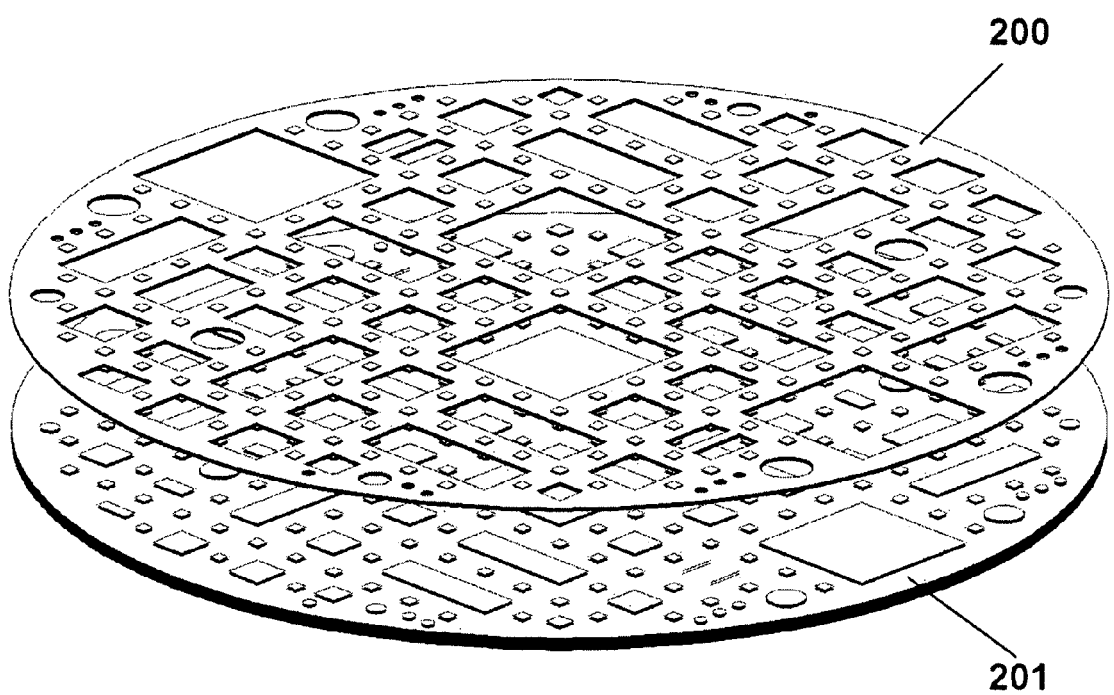
FIG. 3 is an exploded three-dimensional representation, illustrating the alignment of a spacer board and a printed circuit board (PCB).

FIG. 3 is an exploded three-dimensional representation of boards 200 and 201, illustrating how these two elements are aligned.

Figure 4:
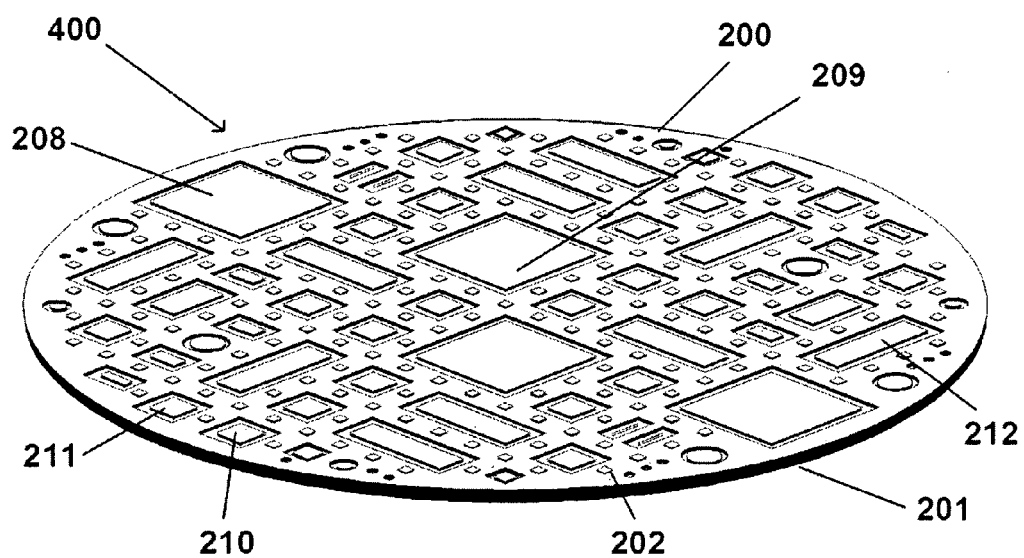
FIG. 4 is a three-dimensional representation of the boards in FIG. 3 in full contact.

FIG. 4 is a three-dimensional representation 400 of boards 200 and 201 in full contact, in which it can be seen that the electrical devices 208-212 pass through the openings in board 200. Electrical contacts 202 mounted on board 201 are in a position to accept contact from above.

Figure 5:
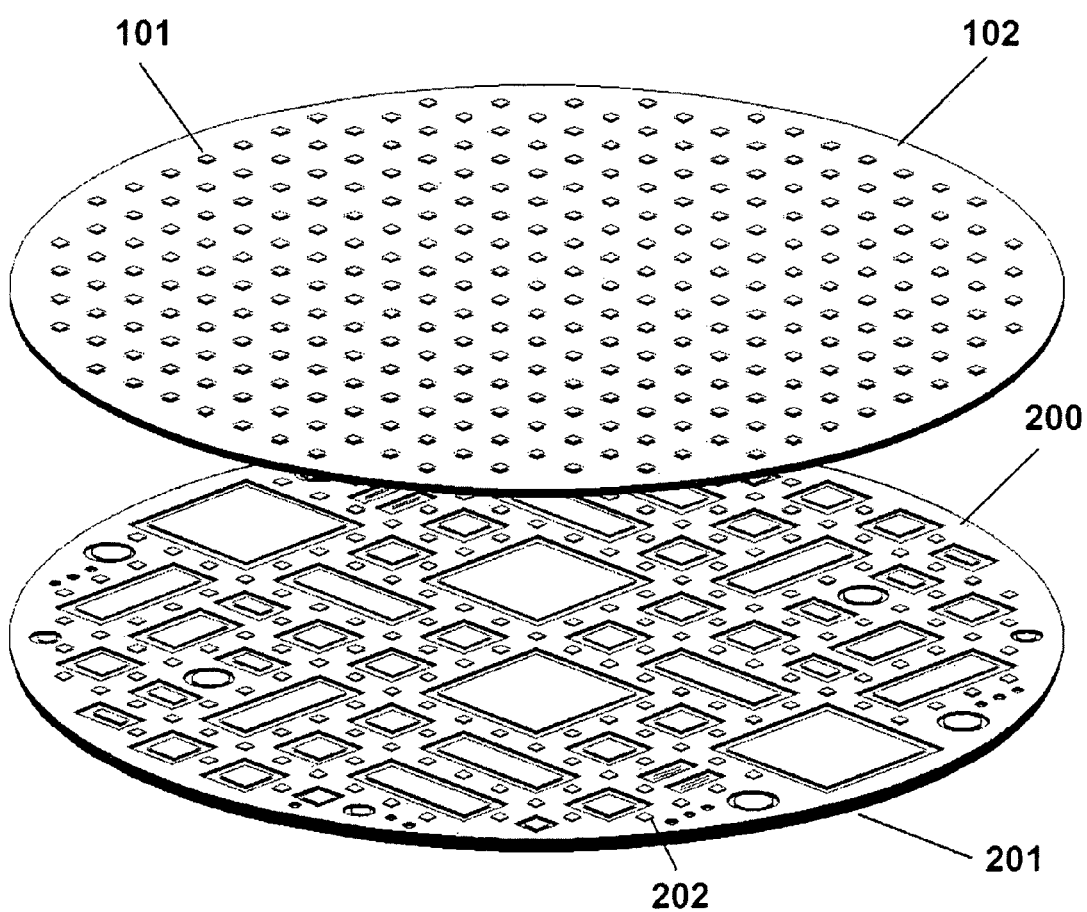
FIG. 5 is a three-dimensional representation of the boards of FIG. 2 in alignment.

FIG. 5 is a three-dimensional representation of the alignment of board 101 with boards 200 and 201 of FIG. 4. It is noted that the electrical contacts on upper surface 102 of board 101 are also exposed on the underside of board 101, and are aligned with electrical contacts 202. It can also be seen that the underside of board 101 may contain more pads than are intercepted on spacer board 200.

In one embodiment of the present invention, the TWST includes a substrate having a plurality of electronic components and a plurality of contacts disposed on a first major surface thereof; a spacer board having a plurality of cut-outs therein, the spacer board disposed superjacent the substrate; and a tester interface connection board disposed superjacent the spacer board; wherein the cut-outs in the spacer board are configured to provide openings by means of which the spacer board may pass those electronic components and be in physical contact with at least a portion of the plurality of contacts on the substrate; and wherein the tester interface connection board includes contacts on each of two opposite major surfaces thereof, at least a portion of the contacts on a first of the two major surfaces electrically connected to a corresponding portion of the contacts of a second of the two major surfaces, and at least a portion of the electrical contacts of the spacer board are in electrical contact with the electrical contacts of the surface of the tester interface connection board that faces the spacer board.

In another embodiment, the electrical contacts on the major surface of the tester interface connection board that faces away from the spacer board are arranged in a pattern such that electrical connection may be made between those contacts and the contacts of a wafer-level tester system.

In another embodiment, a switch matrix board is attached subjacent the substrate.

In various embodiments, one or more of the substrate, switch matrix board, spacer board, and tester interface connection board are fixedly attached to each other. In some embodiments, fixed attachment is obtained through the use of copper core solder balls. In alternative embodiments, fixed attachment is obtained through the use of adhesives. In alternative embodiments, fixed attachment is obtained through the use of gaskets.

One method of attachment between boards comprises disposing, on selected contact surfaces of a first of the boards, a planar array of solder balls with high melting point cores as known in the art, placing a second board over the first board so that selected contact surfaces of the second board contact the solder balls, heating the assembly to melt the solder balls and thereby wet the contact surfaces while applying substantially uniform external pressure thereto, and cooling the assembly to solidify the solder for making a rigid electrical connection between the boards. Solder balls with high melting point cores provide spacing between the boards for electrically isolating the boards.

Figure 6:
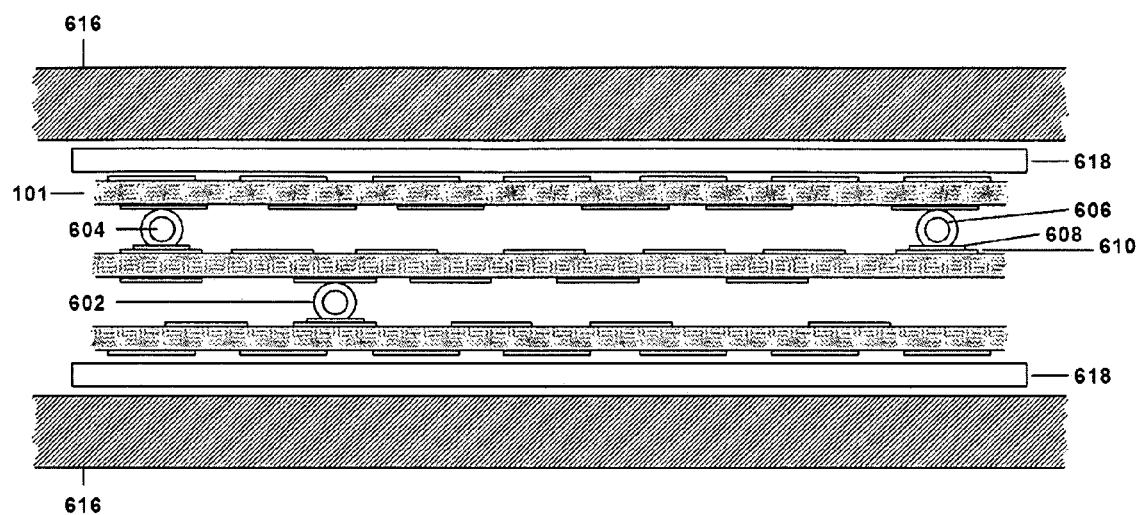
FIG. 6 is a schematic cross-sectional view of the elements in a method for attaching the boards within a TWST assembly.

FIG. 6 is a schematic cross-sectional representation of a section of a TWST assembly, illustrating the attachment of boards in a TWST assembly using high melting point core solder balls. Connective pads 610 may receive a printed adhesive 608, such as solder flux or solder paste. The boards may then be aligned between pressure plates 616 buffered by a layer of thermal foam 618, for attachment with solder balls 602 containing a high melting core 604 surrounded by solder 606.

Figure 7:
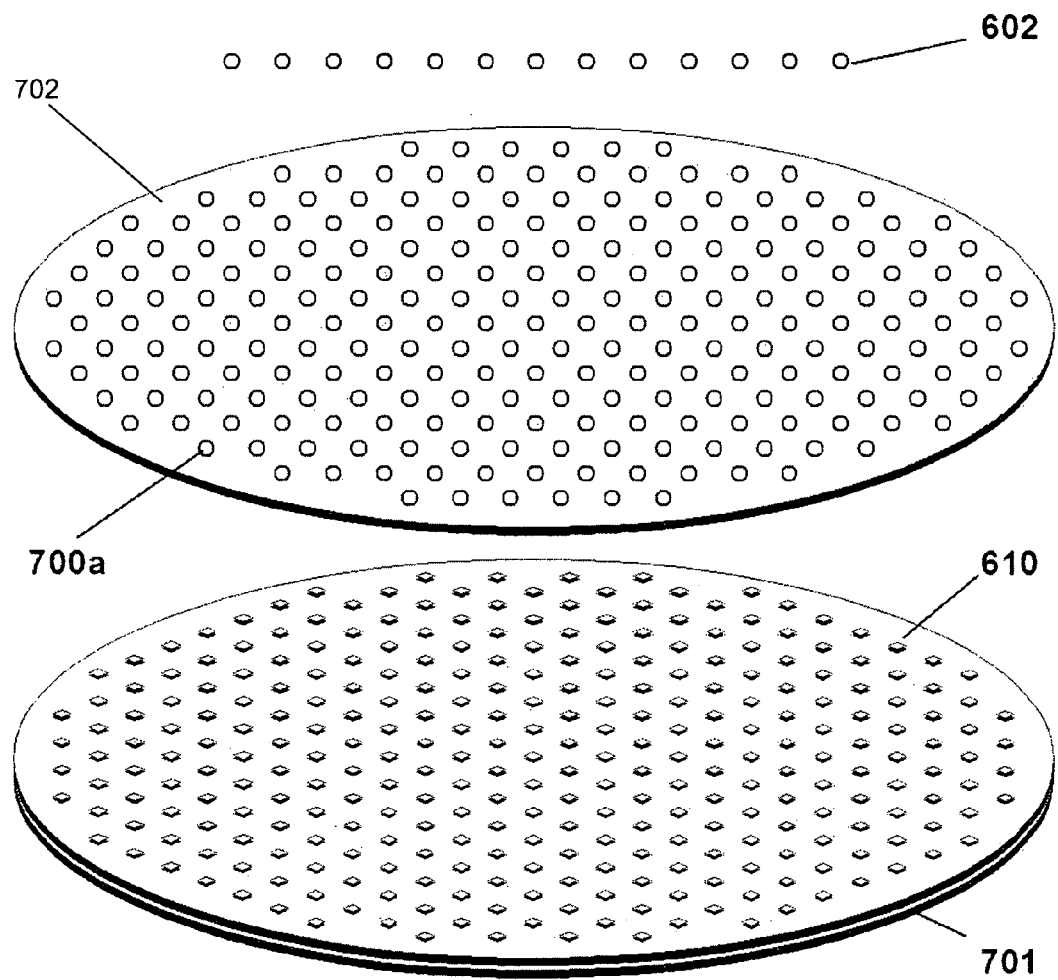
FIG. 7 illustrates the use of a perforated mask.

FIG. 7 is a schematic cross-sectional representation of section of a circuit board or wafer 701, showing connective pad 610, adhesive 608, and solder ball 602 brought into alignment by a perforated mask 702.

FIG. 7 is a three-dimensional view of perforated mask 702, in which each iteration of perforation 700a is of a diameter to allow exactly one high melting core solder ball 602 to contact a conductive pad 610 on wafer 701, below.

Figure 8:
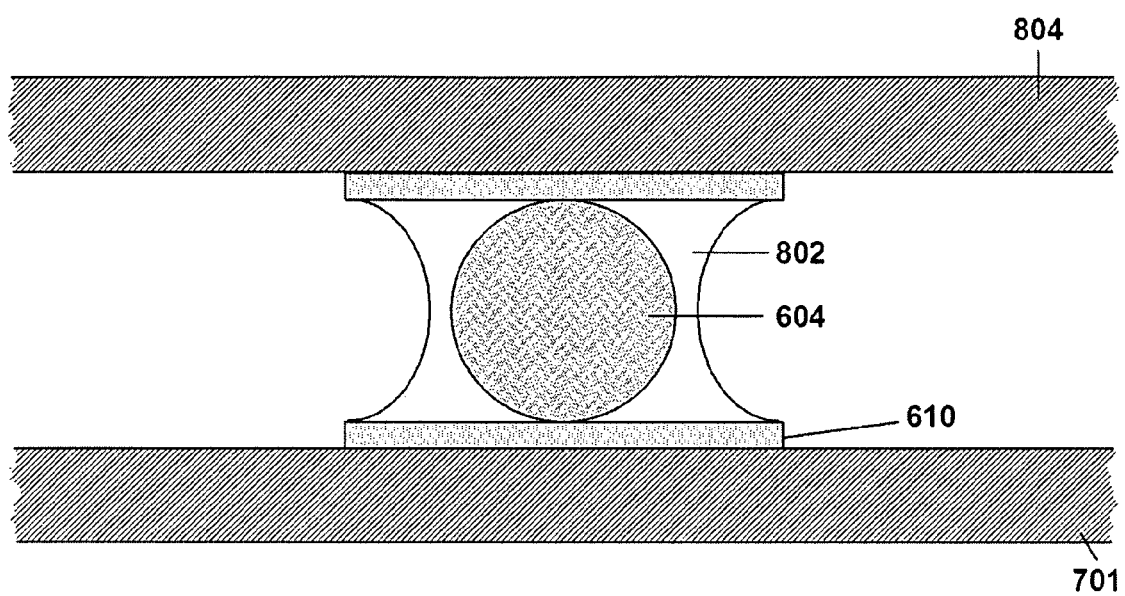
FIG. 8 is a schematic cross-sectional representation of a pair of conductive pads joined by a solder ball.

FIG. 8 is a schematic cross-sectional representation of pad 610 on board 701, after application of pressure and reflow. Melted solder 802 forms a connective bond between connective pads 610 and the corresponding pad on upper board 804, while high melting core 604 determines the space between the joined conductive pads.

CONCLUSION

The exemplary methods and apparatus illustrated and described herein find application in the field of integrated circuit test and analysis.

What is claimed is:

1. A method of determining operational characteristics of a wafer-level test system, comprising:
   providing an electronic assembly suitable for testing and calibrating a wafer-level test system, the electronic assembly including a first major surface with a plurality of electrical contact terminals disposed thereon and configured to make electrical contact with a wafer-level test system;
   coupling the electronic assembly to the wafer-level test system;
   operating the wafer-level test system such that a plurality of signals are communicated to the electronic assembly;
   processing, on the electronic assembly, the plurality of signals communicated from the wafer-level test system; and
   generating on the electronic assembly one or more electrical signals indicative of the operational characteristics of the wafer-level test system;
   wherein the electronic assembly comprises a substrate with a first plurality of electrical components disposed thereon; and a first stack-on layer with a second plurality of electrical components disposed thereon, the first stack-on layer disposed on the substrate;
   wherein the first stack-on layer has openings therein, by means of which, uppermost portions of the first plurality of electrical components may extend through the first stack-on layer.

2. The method of claim 1, further comprising storing, on the electronic assembly, the one or more electrical signals indicative of the operational performance of the wafer-level test system.

3. The method of claim 2, further comprising removing the electronic assembly from the wafer-level test system; and communicating the one or more electrical signals indicative of the operational performance of the wafer-level test system to another electrical system.

4. The method of claim 1, further comprising wirelessly transmitting, from the electronic assembly, the one or more electrical signals indicative of the operational performance of the wafer-level test system.

5. The method of claim 1, further comprising sensing, at each of a plurality of locations on the electronic assembly, a temperature.

6. The method of claim 1, further comprising sensing, at each of a plurality of locations on the electronic assembly, a pressure.

7. The method of claim 1, further comprising operating a switch matrix that is disposed within the electronic assembly.

8. The method of claim 1, wherein the thickness of the electronic assembly is substantially the same as the thickness of a wafer.

9. The method of claim 1, wherein the thickness of the electronic assembly is substantially the same as the thickness of a wafer and a wafer translator disposed on the wafer.

10. The method of claim 1, wherein a thermal impedance of the electronic assembly is substantially the same as a wafer under test.

\* \* \* \* \*